United States Patent
Huang et al.

(10) Patent No.: US 7,741,714 B2
(45) Date of Patent: Jun. 22, 2010

(54) BOND PAD STRUCTURE WITH STRESS-BUFFERING LAYER CAPPING INTERCONNECTION METAL LAYER

(75) Inventors: Tai-Chun Huang, Kaohsiung (TW); Chih-Hsiang Yao, Taipei (TW); Wen-Kai Wan, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 882 days.

(21) Appl. No.: 10/979,408

(22) Filed: Nov. 2, 2004

(65) Prior Publication Data
US 2006/0091536 A1    May 4, 2006

(51) Int. Cl.
*H01L 23/52* (2006.01)
(52) U.S. Cl. .............. 257/754; 257/773; 257/E23.02; 257/E23.16
(58) Field of Classification Search .......... 257/773, 257/750–754, E23.02, E23.16
See application file for complete search history.

(56) References Cited

U.S. PATENT DOCUMENTS

| | | | |
|---|---|---|---|
| 4,917,759 A | 4/1990 | Fisher et al. | |
| 5,587,336 A | 12/1996 | Wang et al. | |
| 6,222,270 B1 | 4/2001 | Lee | |
| 6,255,586 B1 * | 7/2001 | Kim et al. | 174/538 |
| 6,350,667 B1 | 2/2002 | Chen et al. | 438/612 |
| 6,960,831 B2 * | 11/2005 | Burrell et al. | 257/751 |
| 2001/0016415 A1 * | 8/2001 | Chen | 438/637 |
| 2002/0000671 A1 * | 1/2002 | Zuniga et al. | 257/773 |
| 2004/0171246 A1 | 9/2004 | Akram | |
| 2004/0224491 A1 * | 11/2004 | Datta | 438/613 |

FOREIGN PATENT DOCUMENTS

| | | |
|---|---|---|
| CN | 1449033 | 10/2003 |
| JP | 05343466 | 12/1993 |

OTHER PUBLICATIONS

China Search Report mailed Apr. 13, 2007.

\* cited by examiner

*Primary Examiner*—Davienne Monbleau
*Assistant Examiner*—Matthew Reames
(74) *Attorney, Agent, or Firm*—Thomas, Kayden, Horstemeyer & Risley

(57) ABSTRACT

A bond pad structure for an integrated circuit chip has a stress-buffering layer between a top interconnection level metal layer and a bond pad layer to prevent damages to the bond pad structure from wafer probing and packaging impacts. The stress-buffering layer is a conductive material having a property selected from the group consisting of Young's modulus, hardness, strength and toughness greater than the top interconnection level metal layer or the bond pad layer. For improving adhesion and bonding strength, the lower portion of the stress-buffering layer may be modified as various forms of a ring, a mesh or interlocking-grid structures embedded in a passivation layer, alternatively, the stress-buffering layer may has openings filled with the bond pad layer.

32 Claims, 9 Drawing Sheets

BOND PAD STRUCTURE WITH STRESS-BUFFERING LAYER CAPPING INTERCONNECTION METAL LAYER

FIELD OF THE INVENTION

The present invention relates to bond pad structures, and particularly to a bond pad structure with a stress-buffering layer capping interconnection metal layers for preventing stress induced failure from WAT (wafer accept test) and packaging impacts.

BACKGROUND OF THE INVENTION

Bonding pads are interfaces between integrated circuits contained in semiconductor chips and a device package. Each bonding pad is connected to one or more contact pads on an IC-mounting surface of the device package through wire bonding, tape automated bonding, or flip chip technologies. Copper exhibits higher conductivity and greater mechanical integrity, and therefore becomes the material of choice for interconnection wires, contacts and bond pads in future generations. An insulating material that possesses a dielectric constant as low as possible, such as a dielectric constant (k) below the dielectric constant of about 3.9 of silicon dioxide, has been used in copper back-end-of-line (BEOL) interconnection technologies to avoid increased problems of capacitive coupling (cross-talk) and propagation delay. Copper is essentially a material that is quite easily oxidized and easily enhances its oxidation due to moisture in air, thus an aluminum pad providing high resistance against oxidation is used to cap an upper portion of copper interconnection. This aluminum pad allows use of the same bonding tools and processes used in aluminum interconnection technologies. When the aluminum pad is deposited on the copper layer, however, most of aluminum is consumed reacting with the underlying copper, forming $CuAl_2$. A diffusion barrier layer of tantalum nitride is necessary, inserted between the aluminum pad and the underlying copper layer, to prevent the reaction between these metals. U.S. Pat. No. 6,350,667 incorporated herein by reference, describes an adhesion aluminum layer inserted between tantalum nitride and copper for improving adhesion in the pad metal stack structure.

Modern IC designs with high circuit density require a significantly increased number of pins and bonding pads to reduce bonding pad pitch and size. Large mechanical stresses inherent in bonding operations, however, easily damage smaller bonding pads. When an IC chip is under a wafer accept test (WAT), such as a wafer probing test or the like, a probe pin may damage the soft surface of the aluminum pad, and thereby the underlying copper layer is exposed to air and may be corroded. The corroded pads caused by this type of pad voids degrade the bondability of wire connection. In package processing, including wafer sorting, wire bonding, flip-chip packaging, or probe pin testing, applied forces or large mechanical stresses may crack an inter-metal dielectric (IMD) layer adjacent to a probe pin region. The crack may extend into the interior of the IMD layer surrounding the top level copper layer, causing corrosion and layer-open problems. This also causes the aluminum pad to peel from the top level copper layer, thus the pad-open problem causes the wire to lose contact with the aluminum pad, decreasing bonding reliability. Additionally, the pitch and size of the bonding pad cannot be further shrunk as the bonding pad is susceptible to damage from the mechanical stress, thus limiting chip size reduction in next generation technologies.

SUMMARY OF THE INVENTION

It is an object of the present invention to provide an improved bond pad structure having a stress-buffering layer between a top interconnection level metal layer and a bond pad layer to prevent stress-induced damages to the bond pad structure from wafer acceptance test (WAT) and packaging impacts.

To achieve the above objective, the present invention provides a bond pad structure has first metal layer on an integrated circuit substrate. A bond pad layer is located over the first metal layer and electrically connected to the first metal layer. A stress-buffering layer is located between the first metal layer and the bond pad layer. The stress-buffering layer has a property selected from the group consisting of Young's modulus, hardness, strength and toughness greater than that of at least one of the first metal layer and the bond pad layer.

To achieve the above objective, the present invention provides a bond pad structure has a copper-based metal layer on an integrated circuit substrate. A passivation layer is located over the copper-based metal layer and has at least one first opening that exposes at least part of the copper-based metal layer. A stress-buffering layer is formed overlying the passivation layer along the first opening. An aluminum-based bond pad layer is located over the stress-buffering layer and electrically connected to the copper-based metal layer. The stress-buffering layer has a property selected from the group consisting of Young's modulus, hardness, strength and toughness greater than that of at least one of the aluminum-based bond pad layer and the copper-based metal layer.

To achieve the above objective, the present invention provides a bond pad structure has a copper-based metal layer located over an integrated circuit substrate. A passivation layer is located over the copper-based metal layer and has at least one first opening that exposes at least part of the copper-based metal layer. A first interposed layer lines the first opening of the passivation layer. A tungsten layer is formed overlying the first interposed layer along the first opening. A second interposed layer is formed overlying the tungsten layer along the first opening. An aluminum-based bond pad layer is formed overlying the second interposed layer and electrically connected to the copper-based metal layer.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION OF THE PREFERRED EMBODIMENTS

Figure 1A:
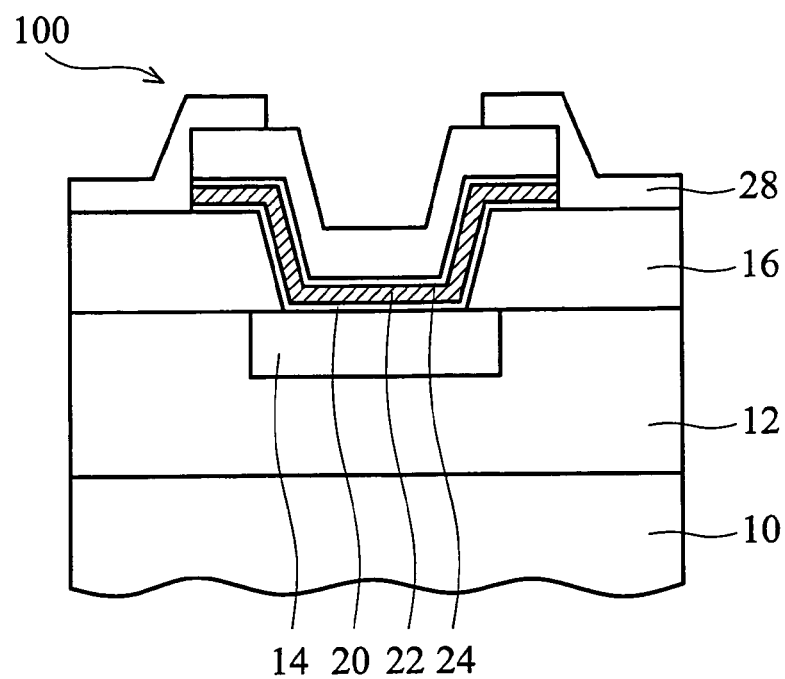
FIGS. 1A to 1D are cross-sectional diagrams illustrating bond pad structures according to embodiments of the present invention.

The present invention provides an improved bond pad structure for an integrated circuit chip. An embodiment of the present invention provides a bond pad structure having a stress-buffering layer between a top interconnection level metal layer and a bond pad layer to prevent stress-induced damages to the bond pad structure from WAT (e.g., wafer probing) and packaging impacts (e.g., applied forces and induced stresses in wire bonding, flip chip or other packaging technologies). The stress-buffering layer is preferably a conductive material having a specific property selected from the group consisting of Young's modulus, hardness, strength and toughness, greater than that of at least one of the top interconnection level metal layer and the bond pad layer. One embodiment of the present invention provides a bond pad structure having a stress-buffering layer between a terminal contact region of a top interconnection level copper-based layer and an aluminum-based bond pad layer on an integrated circuit chip having at least one low-k inter-metal dielectric (IMD) layer with a dielectric constant less than 3.9. The stress-buffering layer composed of conductive materials with greater mechanical integrity, which favors the use of tungsten (W) with a Young's modulus greater than that of copper and aluminum as the material of choice. One embodiment of the present invention modifies the stress-buffering layer as various forms of strips, islands, mesh or interlocking-grid structures for improving adhesion and bonding strength. One embodiment of the present invention provides at least part of integrated circuits located under the bond pad structure, referred to as circuits under pad (CUP), for a more efficient use of chip area or a reduction of chip size.

In the context of this disclosure for back-end-of-line (BEOL) interconnection technologies, the term "$M_{top}$ metal layer" refers to a first-level metal layer fabricated as the top interconnection level metal layer, the term "$M_{top-1}$ metal layer" refers to a second-level metal layer fabricated underlying the $M_{top}$ metal layer, and the term "$M_{top-N}$ metal layer" refers to an $N^{th}$-level metal layer fabricated underlying the $M_{top-(N-1)}$ metal layer, wherein N is an integer equal to or larger than 1. The present invention preferably uses copper-based conductive materials for forming the $M_{top}$ metal layer and the $M_{top-N}$ metal layer. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection. Although the preferred embodiments of the present invention illustrate copper interconnection patterns, the present invention provides value when using metallic materials excluding copper for BEOL interconnection.

Hereinafter, reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented.

FIG. 1A is a cross-sectional diagram illustrating a bond pad structure 100 according to an embodiment of the present invention. An example of an integrated circuit substrate 10 used for interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a substrate comprising Ge, GaAs, GaP, InAs and InP. The integrated circuits as used herein refer to electronic circuits having multiple individual circuit elements, such as transistors, diodes, resistors, capacitors, inductors, and other active and passive semiconductor devices.

On the substrate 10, an inter-metal dielectric (IMD) layer 12 is fabricated as a top-level IMD layer, and an $M_{top}$ metal layer 14 is formed in the IMD layer 12. The $M_{top}$ metal layer 14 comprises a terminal contact region, which is a portion of conductive routs and has an exposed surface in electrical communication with a bond pad layer 26. The $M_{top}$ metal layer 14 may be treated by a planarization process, such as chemical mechanical polishing (CMP), achieving a planarized surface planar with the IMD layer 12. Suitable materials for the $M_{top}$ metal layer 14 may include, but are not limited to, for example copper, copper alloy, or other copper-based conductive materials. The IMD layer 12 is formed of a thickness of about 1000 angstroms to about 20000 angstroms through any of a variety of techniques, including, spin coating, CVD, and future-developed deposition procedures. The IMD layer 12 may comprise $SiO_2$, $SiN_x$, SiON, PSG, BPSG, F-containing $SiO_2$, or various types of low-k films of a comparatively low dielectric constant dielectric material with a k value less than about 3.9, e.g., 3.5 or less. A wide variety of low-k materials may be employed in accordance with embodiments of the present invention, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, or porous organic series material.

A first passivation layer 16 is deposited and then patterned to provide a pad opening 18 that defines a contact via region of the underlying $M_{top}$ metal layer 14. For the sake of protecting the integrated circuit chip from external environment effects, the first passivation layer 16 comprises at least one material that is capable of preventing moisture or ions from contacting the $M_{top}$ metal layer 14, such as silicon oxide or silicon nitride. The first passivation layer 16 may be formed in a single-layer form or a multi-layer structure including any one of TEOS oxide, silicon nitride, and plasma enhanced silicon oxide. The first passivation layer 16 typically has a thickness of from about 500 angstroms to about 200000 angstroms. The pad opening 18 is a terminal via opening that is formed using lithographic, masking and dry etch technologies to expose the terminal contact region of the $M_{top}$ metal layer 14.

Figure 1B:
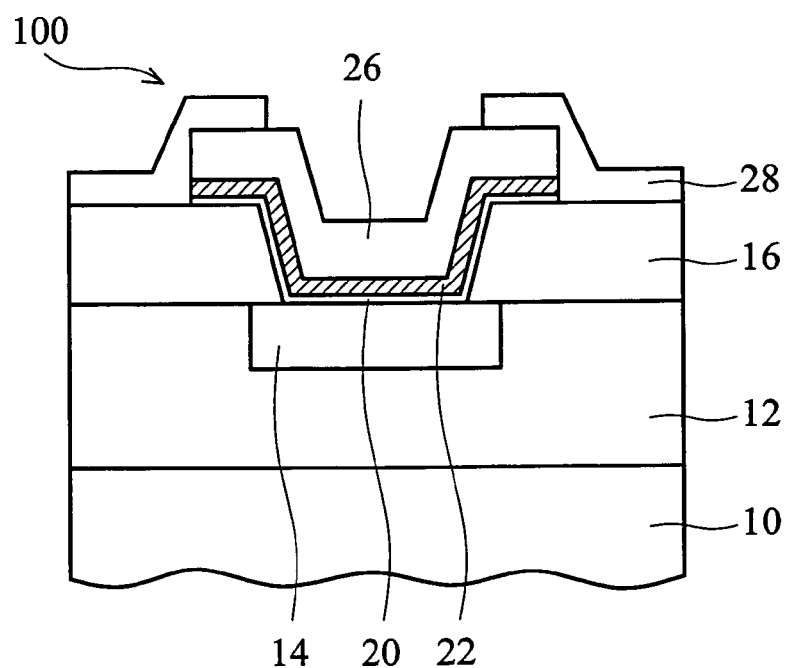
Figure 1C:
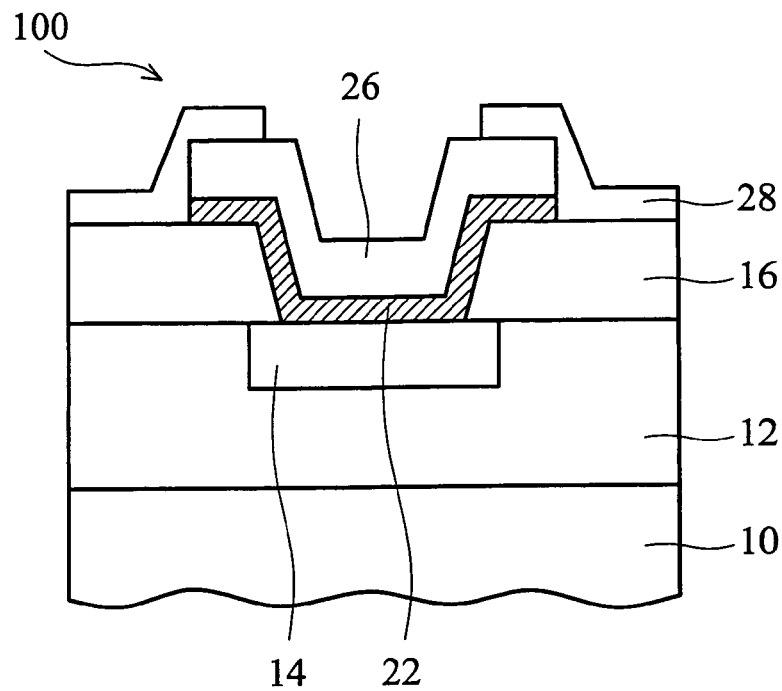

Prior to a deposition process for the bond pad layer 26, a first interposed layer 20, a stress-buffering layer 22 and a second interposed layer 24 are successively deposited along the bottom and sidewalls of the pad opening 18. At least one of the first interposed layer 20 and the second interposed layer 24 may be an optional deposition layer depending upon types of materials used in the bond pad structure 100, but the stress-buffering layer 22 is needed for capping the underlying $M_{top}$ metal layer 14. FIG. 1A illustrates a triple-layered structure including the first interposed layer 20, the stress-buffering layer 22 and the second interposed layer 24. The present invention also provides value when either the first interposed layer 20 or the second interposed layer 24 is omitted in the pad opening 18 as shown in FIGS. 1B and 1C.

The first interposed layer 20 conformally lining the pad opening 18 may comprise a metal-diffusion barrier layer, an adhesion layer, or a combination thereof. The first interposed layer 20 provides both an excellent diffusion barrier in combination with good conductivity. The first interposed layer 20 also improves good adhesion properties between the stress-buffering layer 22 and the underlying $M_{top}$ metal layer 14. The first interposed layer 20 may include, but is not limited to, a refractory material, TiN, TaN, Ta, Ti, TiSN, TaSN, Cr, TiW, WN, mixtures thereof, combinations thereof, alloys thereof, or other materials that can protect copper from exposure to air, by means of physical vapor deposition (PVD), chemical vapor deposition (CVD), atomic layer deposition (ALD), electroplating, electroless plating, sputtering, or other like deposition techniques. The first interposed layer 20 may have a thickness of from about 50 angstroms to about 1500 angstroms.

Figure 1D:
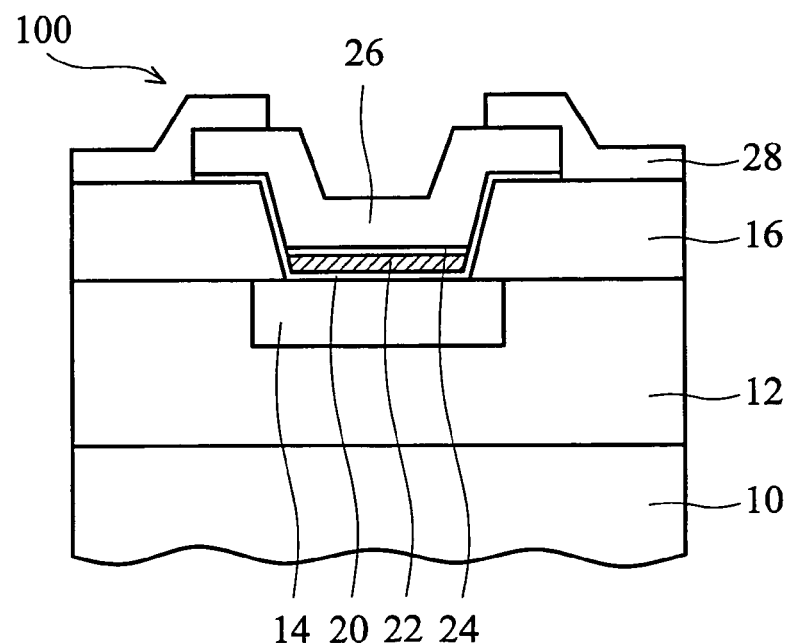

The stress-buffering layer 22 is preferably a conductive material having a mechanical property selected from the group including Young's modulus, hardness (e.g., Minernl hardness, Brinell hardness, and Vikers hardness), strength and toughness, greater than that of at least one of the $M_{top}$ metal layer 14 and the subsequently deposited bond pad layer 26. For example, the stress-buffering layer 22 is a tungsten (W) layer, which has a Young's modulus (or hardness) greater than that of copper and aluminum. In experimental measurement, tungsten has more than three times the Young's modulus of copper and about ten times the Vikers hardness of copper. Tungsten has more than five times the Young's modulus of aluminum and about twenty times the Vikers hardness of aluminum. The thickness of the stress-buffering layer 22 may vary depending upon types of materials and thickness used in the bond pad layer 26 as well as bond pad resistivity requirements. Preferably, the stress-buffering layer 22 has a thickness of from about 500 angstroms to about 5000 angstroms. In one embodiment, as shown in FIG. 1A, the stress-buffering layer 22 is deposited on the first interposed layer 20 along the bottom and sidewalls of the pad opening 18. In one embodiment, as shown in FIG. 1D, the stress-buffering layer 22 is deposited over at least part of the pad area, for example, only along the bottom of the pad opening 18.

The second interposed layer 24 deposited on the stress-buffering layer 22 may comprise a metal-diffusion barrier layer, an adhesion layer, or a combination thereof. The second interposed layer 24 provides both an excellent diffusion barrier in combination with good conductivity. The second interposed layer 24 also improves good adhesion properties between the stress-buffering layer 22 and the bond pad layer 26. The second interposed layer 24 may be composed of the same materials as the first interposed layer 20, for example a refractory material, TiN, TaN, Ta, Ti, TiSN, TaSN, Cr, TiW, WN, mixtures thereof, combinations thereof or alloys thereof, by means of physical PVD, CVD, ALD, electroplating, electroless plating, sputtering, or other like deposition techniques. The second interposed layer 24 may have a thickness of from about 50 angstroms to about 1500 angstroms.

The bond pad layer 26 is deposited over the second interposed layer 24, at least filling the pad opening 18, through the use of PVD, CVD, ALD, electroplating, electroless plating, sputtering, or the like deposition techniques. The bond pad layer 26 is preferably an aluminum-based material, such as aluminum, AlCu alloy, or AlCuSi alloy. The bond pad layer 26 may have a thickness of from about 1000 angstroms to about 20000 angstroms. The bond pad layer 26, the second interposed layer 24, the stress-buffering layer 22 and the first interposed layer 20 are then patterned utilizing lithography, masking and dry etch (e.g., plasma etch or reactive ion etch) processes known in the art, resulting in a stack metal pad pattern in electrical communication with the underlying $M_{top}$ metal layer 14. Further processing may then proceed, for example a second passivation layer 28 that is optionally provides on the stack metal pad pattern to expose the bond pad layer 26 for subsequent package/assembly processes.

Figure 2A:
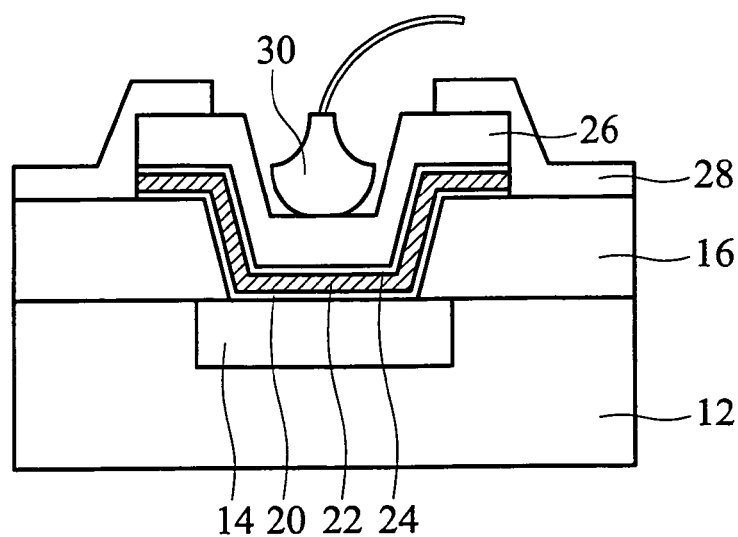
FIG. 2A is a cross-sectional diagram illustrating a wire ball bonded on a bond pad structure according to an embodiment of the present invention.
Figure 2B:
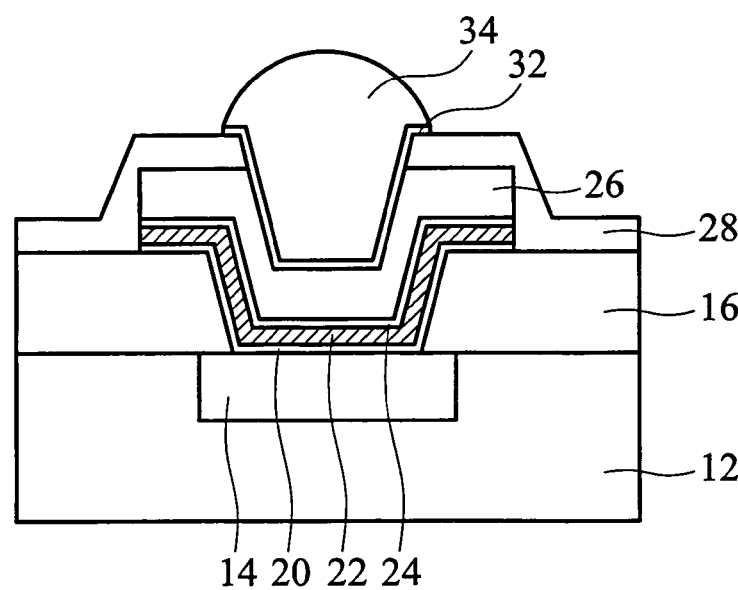
FIG. 2B is a cross-sectional diagram illustrating a metal bump formed on a bond pad structure according to an embodiment of the present invention.

FIG. 2A is a cross-sectional diagram illustrating a wire ball bonded on a bond pad structure according to an embodiment of the present invention, and FIG. 2B is a cross-sectional diagram illustrating a metal bump formed on a bond pad structure according to an embodiment of the present invention, while explanation of the same or similar portions to the description in FIG. 1A will be omitted. For wire bonding applications, as shown in FIG. 2A, a wire ball 30 is bonded on the bond pad layer 26 by means of thermal compression, thermal sonic or ultrasonic processes. The wire ball 30 may be composed of gold (with optional very small contents of beryllium, copper, palladium, iron, silver, calcium or magnesium), copper, or aluminum. For flip chip packaging applications, as shown in FIG. 2B, an under bump metallurgy (UBM) structure 32 and a metal bump 34 are successively formed on the bond pad layer 26. Variety of the UBM structures 32 is known to those skilled in the art that have one, two, three or more layers depending on whether the metal bump 34 is gold, copper, aluminum, Pb, Sn, or nickel-based alloys. The UBM structure 32 may be formed of Cr/Cu, Ti/Pd, Ti/W, Ti/Pt, Al/Ni, Cr/Cu/Au, Ni/Cu, Ti/Cu, TiW/Cu, and Ni/Au by electroplating, evaporation, printing, electroless plating, and/or sputtering.

The bond pad structure 100 of the present invention has several advantages over prior art methods. The conductive and conformal stress-buffering layer 24 of a strong rigid material inserted between the $M_{top}$ metal layer 14 and the bond pad layer 26 can provide a greater mechanical integrity in the bond pad structure 100. This can prevent damages to the bond pad structure 100 from applied forces or mechanical stresses caused by WAT (e.g., wafer probing test) and packaging impacts (e.g., wafer sorting, wire bonding, flip-chip packaging, or probe pin testing). Therefore, the problems of stress induced failure and pad peeling can be overcome, and bonding reliability is significantly increased. In addition, the thickness of the stress-buffering layer 22 and the thickness of the bond pad layer 26 are adjustable so as to achieve the resistivity requirement for the bond pad structure 100. In experimental measurements, the combination of a tungsten layer of about 500~1500 angstroms and an aluminum layer of about 6500~7500 angstroms can obtain an effective resistivity of about 4.81E-02 micro-ohm that is almost the same as a measured resistivity of a conventional aluminum pad of about 9000 angstroms.

Figure 3A:
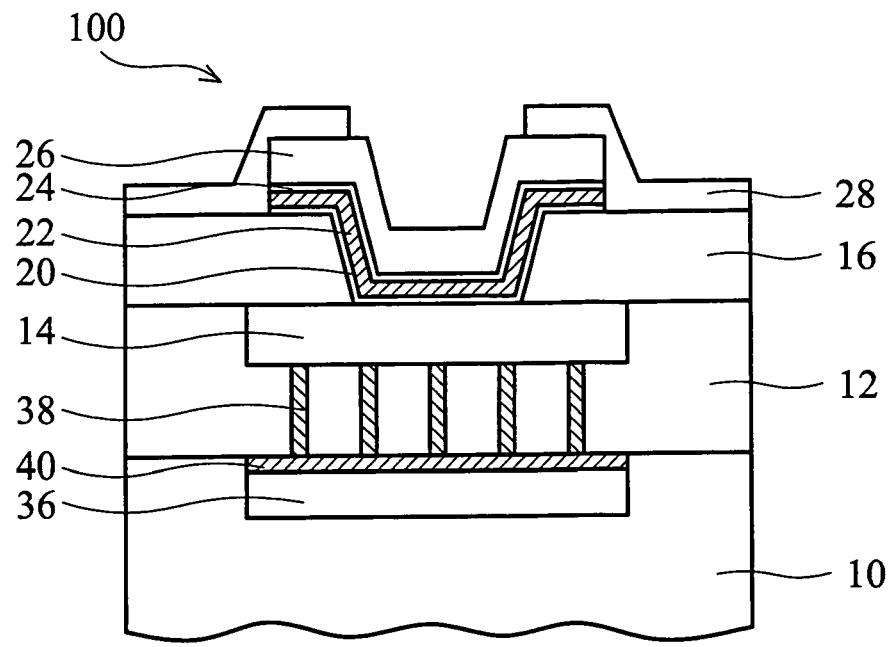
FIGS. 3A and 3B are cross-sectional diagrams illustrating a CUP region located under a bond pad structure according to an embodiment of the present invention.
Figure 3B:
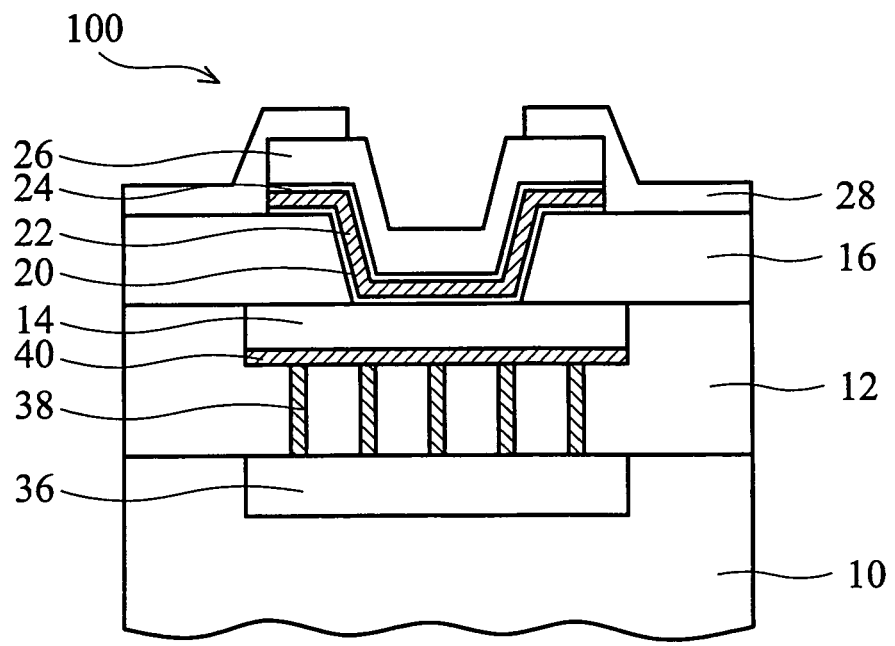

For a more efficient use of chip area or a reduction of chip size, at least part of integrated circuits can be designed under the bond pad structure 100, resulting in a circuits under pad (CUP) region at the $M_{top}$ metal layer 14. FIGS. 3A and 3B are cross-sectional diagrams illustrating a CUP region located under a bond pad structure according to an embodiment of the present invention, while explanation of the same or similar portions to the description in FIG. 1A will be omitted. An $M_{top-1}$ metal layer 36 is located under the IMD layer 12 and electrically connected to the $M_{top}$ metal layer 14 through a plurality of conductive via plugs 38 embedded in the IMD layer 12. An additional stress-buffering layer 40 may be provided on the top of the $M_{top-1}$ metal layer 36, the bottom of the $M_{top}$ metal layer 14, or the combination thereof. The additional stress-buffering layer 40 may be formed of the same materials as the stress-buffering layer 26. Preferably, the additional stress-buffering layer 40 comprises a conductive material having a Young's modulus (or hardness) greater than that of the $M_{top}$ metal layer 14 or the $M_{top-1}$ metal layer 36. More preferably, the additional stress-buffering layer 40 is a tungsten layer with a thickness of from about 500 angstroms to about 5000 angstroms. The additional stress-buffering layer 40 of a strong rigid material can further improve the mechanical integrity under the bond pad structure 100 to reduce or eliminate stress-induced defects.

For improving adhesion and bonding strength, the pad opening 18 can be modified as various opening forms to make the lower portion of the stress-buffering layer 22 as a ring, stripes, islands, a mesh or interlocking via structures embedded in the first passivation layer 16. Similarly, for achieving an optimized vertical conduction, various openings can be defined in the stress-buffering layer 22 to make the lower portion of the bond pad layer 26 as separated stripes, separated islands, or interlocking-grid structures embedded in the stress-buffering layer 22.

Figure 4A:
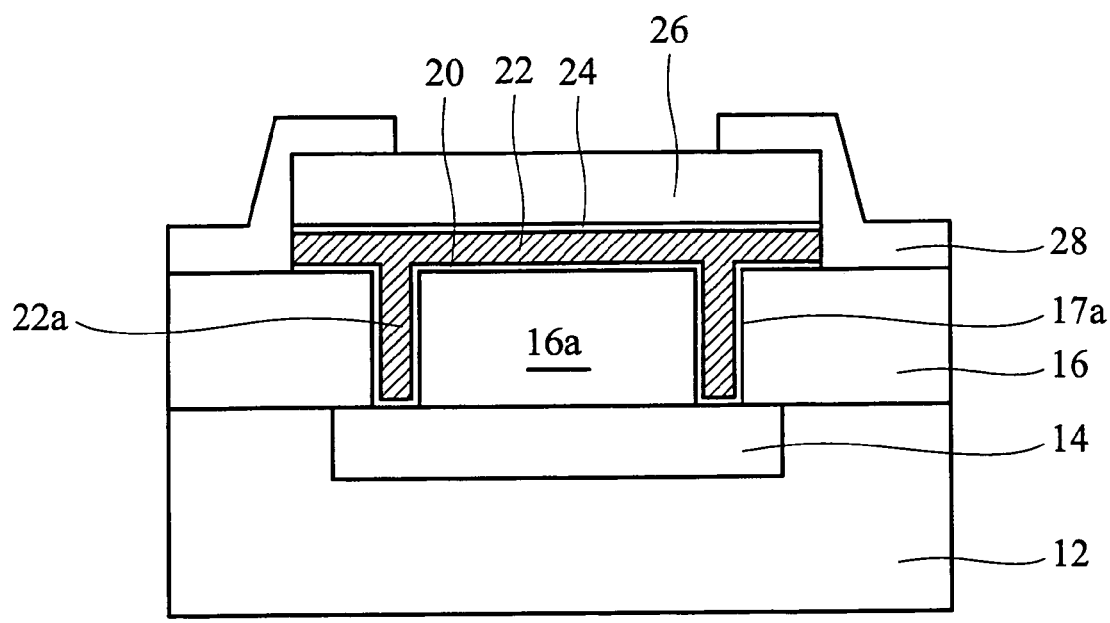
FIG. 4A is a cross-sectional diagram illustrating the stress-buffering layer embedded in a ring-shaped opening of the first passivation layer according to an embodiment of the present invention.
Figure 4B:
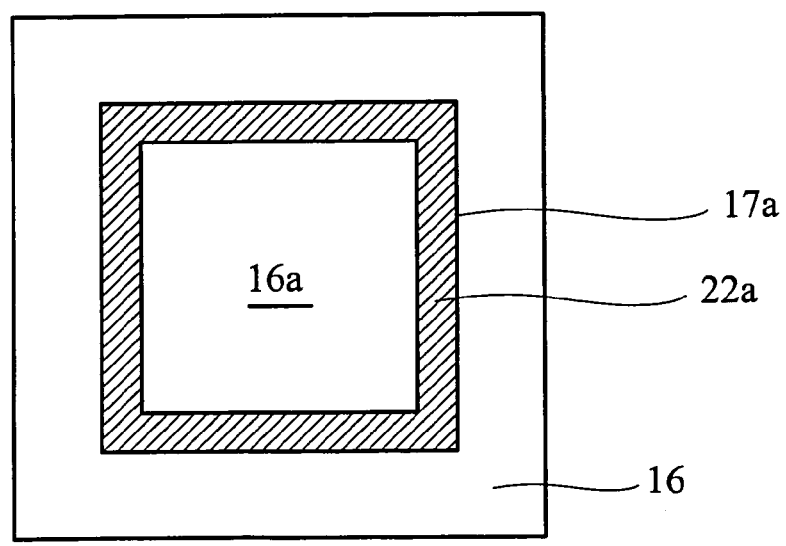
FIG. 4B is a top view illustrating the lower portion of the stress-buffering layer embedded in a ring-shaped opening of the first passivation layer according to an embodiment of the present invention.

FIG. 4A is a cross-sectional diagram illustrating the stress-buffering layer embedded in a ring-shaped opening of the first passivation layer according to an embodiment of the present invention, and FIG. 4B is a top view illustrating the lower portion of the stress-buffering layer embedded in a ring-shaped opening of the first passivation layer according to an embodiment of the present invention, while explanation of the same or similar portions to the description in FIG. 1A will be omitted. Compared with the pad opening 18 shown in FIG. 1A, FIGS. 4A and 4B depict a ring-shaped opening 17a defined in the first passivation layer 16 to expose a corresponding ring-shaped contact region of the $M_{top}$ metal layer 14, and therefore an island region 16a surrounded by the ring-shaped opening 17a is defined in the first passivation layer 16. After lining the ring-shaped opening 17a with the first interposed layer 20, the stress-buffering layer 22 is deposited on the first interposed layer 20 to fill the ring-shaped opening 17a and preferably cover the top surface of the first passivation layer 16. The lower portion of the stress-buffering layer 22 embedded in the ring-shaped opening 17a of the first passivation layer 16, referred to as a ring-type metal support 22a hereinafter, can enhance adhesion among the various layer of the metal stack pad structure and therefore interface separation, peel failures, and interface fracture failures are prevented.

Figure 5A:
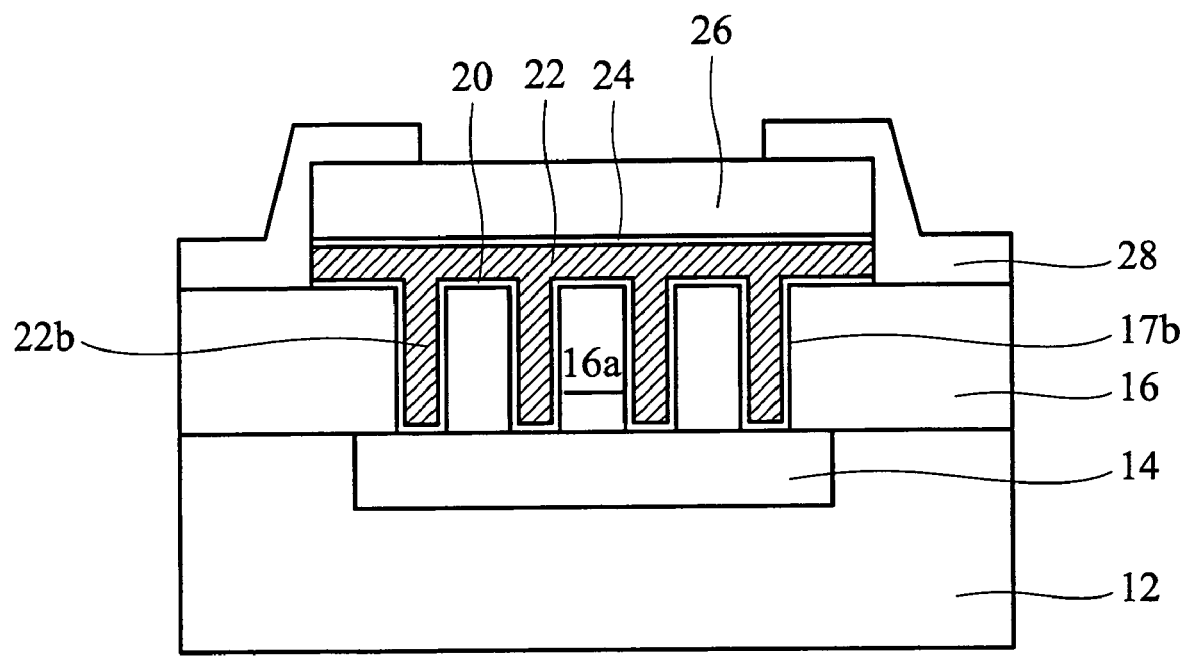
FIG. 5A is a cross-sectional diagram illustrating the stress-buffering layer embedded in an interlocking-grid opening of the first passivation layer according to an embodiment of the present invention.
Figure 5B:
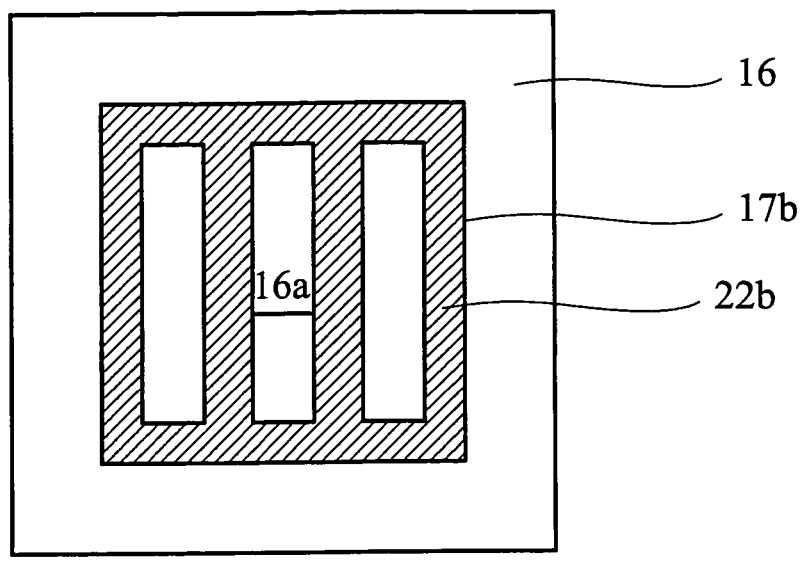
FIGS. 5B and 5C are top views illustrating the lower portion of the stress-buffering layer embedded in an interlocking-grid opening of the first passivation layer according to an embodiment of the present invention.
Figure 5C:
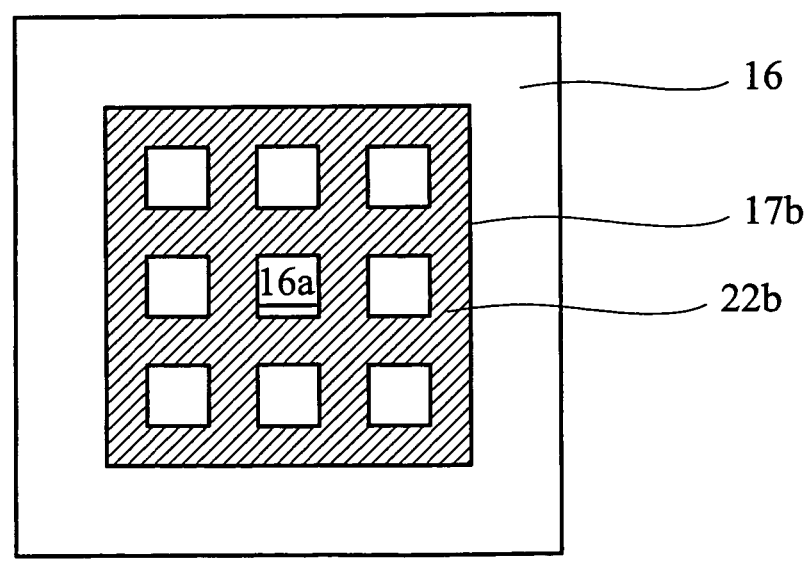

FIG. 5A is a cross-sectional diagram illustrating the stress-buffering layer embedded in an interlocking-grid opening of the first passivation layer according to an embodiment of the present invention, and FIGS. 5B and 5C are top views illustrating the lower portion of the stress-buffering layer embedded in an interlocking-grid opening of the first passivation layer according to an embodiment of the present invention, while explanation of the same or similar portions to the description in FIGS. 4A and 4B will be omitted. Compared with the ring-shaped opening 17a, FIGS. 4B and 4C depict an interlocking-grid opening 17b, such as a fence or a mesh, defined in the first passivation layer 16 to expose corresponding interlocking-grid contact regions of the $M_{top}$ metal layer 14, and therefore the first passivation layer 16 has a plurality of island regions 16a surrounded by the interlocking-grid opening 17b. The lower portion of the stress-buffering layer 22 embedded in the interlocking-grid opening 17b of the first passivation layer 16, referred to as an interlocking-type metal support 22b hereinafter, can enhance adhesion among the various layer of the metal stack pad structure for improved bonding strength.

Figure 6A:
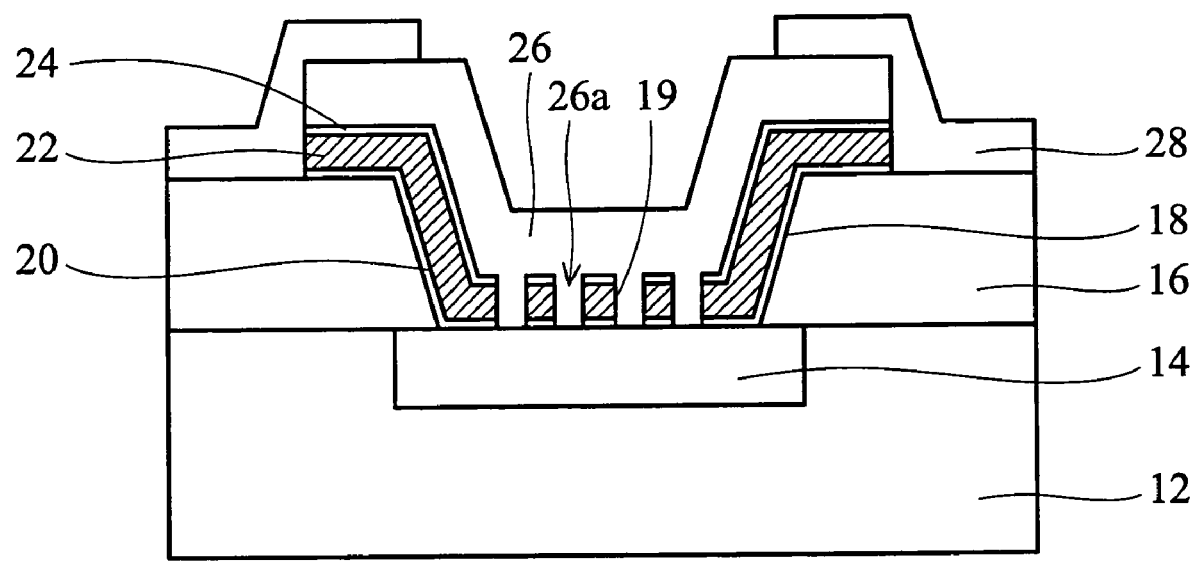
FIG. 6A is a cross-sectional diagram illustrating a lower portion of a bond pad layer embedded in openings of the stress-buffering layer according to an embodiment of the present invention.
Figure 6B:
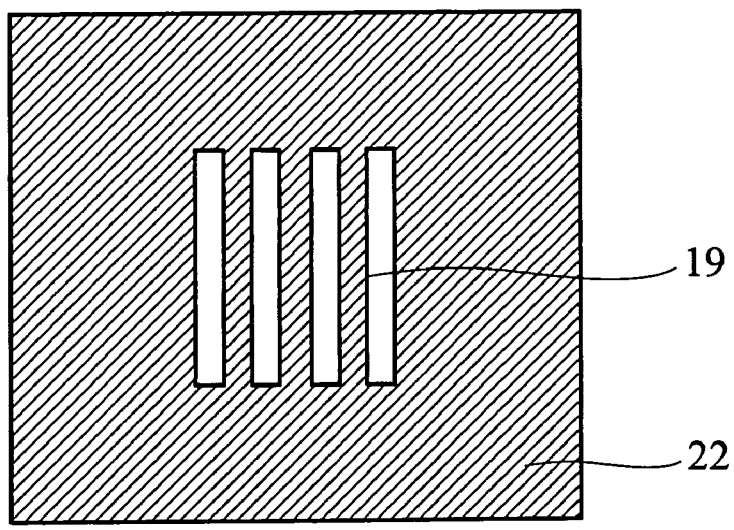
FIGS. 6B and 6C are top views illustrating the openings of the stress-buffering layer according to an embodiment of the present invention.
Figure 6C:
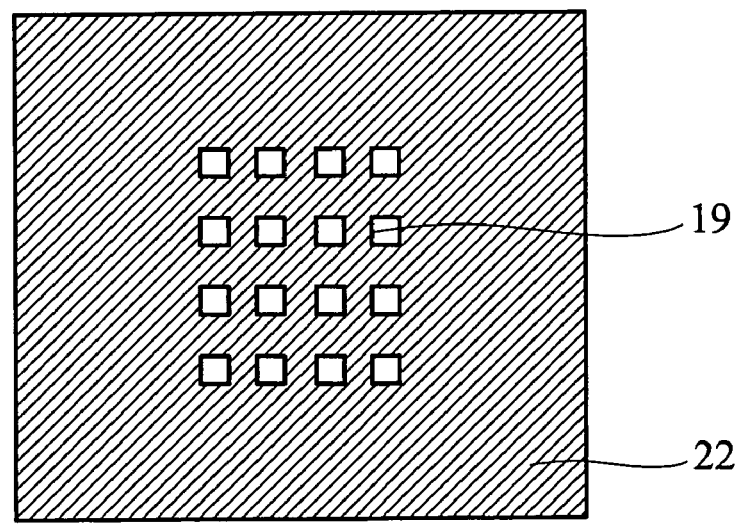

FIG. 6A is a cross-sectional diagram illustrating a lower portion of a bond pad layer embedded in openings of the stress-buffering layer according to an embodiment of the present invention, and FIGS. 6B and 6C are top views illustrating the openings of the stress-buffering layer according to an embodiment of the present invention, while explanation of the same or similar portions to the description in FIGS. 4 and 5 will be omitted. Prior to the deposition process of the bond pad layer 26, at least one opening 19 that penetrates the second interposed layer 24, the stress-buffering layer 22 and the first interposed layer 20 within the pad opening 18, is additionally patterned to expose a corresponding shaped contact region of the $M_{top}$ metal layer 14. Thus, the bond pad layer 26 is subsequently deposited to fill the opening 19 that is smaller than the pad opening 18. The lower portion 26a of the bond pad layer 26 embedded in the opening 19 can directly contact the underlying $M_{top}$ metal layer 14. The number, profile or size of the opening 19 is a matter of design choice dependent on product requirements and process limitations. For example, a plurality of stripe-shaped separated openings 19 is defined in the stress-buffering layer 22 as shown in FIG. 6B, and an array of separated openings 19 is defined in the stress-buffering layer 22 as shown in FIG. 6C.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A bond pad structure, comprising:
   a first metal layer formed on an integrated circuit substrate;
   a passivation layer formed over said first metal layer and having at least one first opening that exposes at least part of said first metal layer;
   a first interposed, single-material layer, a stress-buffering, single-material layer, and a second interposed, single-material layer successively deposited along a bottom and sidewalls of said first opening; and a bond pad layer deposited over and directly contact the second interposed, single-material layer; wherein said stress-buffering, single-material layer has a property selected from the group consisting of Young's modulus, hardness, strength and toughness greater than that of at least one of said first metal layer and said bond pad layer, and is deposited directly on said first interposed, single-material layer along the bottom and sidewalls of said first openings;

said first interposed, single-material layer serves as a metal-diffusion barrier layer directly on said first metal layer, and conformally lines said bottom and said sidewalls of said first opening; and said second interposed, single-material layer serves as a metal-diffusion barrier layer-directly on said stress-buffering, single-material layer.

2. The bond pad structure of claim 1, wherein said stress-buffering, single-material layer comprises a tungsten layer.

3. The bond pad structure of claim 1, wherein said first metal layer comprises copper or copper—based alloy.

4. The bond pad structure of claim 1, wherein said bond pad layer comprises aluminum or aluminum—based alloy.

5. The bond pad structure of claim 1, wherein said first interposed, single-material layer comprises TaN, TiN, Ta, TiW, or WN.

6. The bond pad structure of claim 1, wherein said second interposed, single-material layer comprises TaN, TiN, Ta, TiW, or WN.

7. The bond pad structure of claim 1, wherein said integrated circuit substrate comprises at least one dielectric layer having a dielectric constant less than about 3.9, and said first metal layer is formed in said dielectric layer.

8. The bond pad structure of claim 1, wherein said integrated circuit substrate comprises an integrated circuit, and at least part of said integrated circuit is located under said bond pad structure.

9. The bond pad structure of claim 1,
wherein, said stress-buffering, single-material layer is formed in said first opening and at least located over said first metal layer; and
wherein, said bond pad layer fills said first opening.

10. The bond pad structure of claim 1,
wherein, said passivation layer comprises at least one island region surrounded by said first opening; and
wherein, said stress-buffering, single-material layer is formed overlying said passivation layer and fills said first opening.

11. The bond pad structure of claim 1,
wherein, said stress-buffering, single-material layer is formed over said first metal layer along said first opening;
wherein, said stress-buffering, single-material layer comprises at least one second opening that is smaller than said first opening and exposes at least part of said first metal layer; and
wherein, said bond pad layer is formed overlying said stress-buffering, single-material layer and fills said second opening.

12. The bond pad structure of claim 1, further comprising:
a second metal layer located under said first metal layer;
a plurality of conductive via plugs located between said first metal layer and said second metal layer, and electrically connecting said first metal layer to said second metal layer; and
a buffering layer located between said second metal layer and said plurality of conductive via plugs, wherein said buffering layer has a property selected from the group consisting of Young's modulus, hardness, strength and toughness greater than that of said second metal layer.

13. The bond pad structure of claim 12, wherein said second metal layer comprises copper or copper-based alloy, and said buffering layer comprises a tungsten layer.

14. The bond pad structure of claim 1, further comprising:
a second metal layer located under said first metal layer;
a plurality of conductive via plugs located between said first metal layer and said second metal layer, and electrically connecting said first metal layer to said second metal layer; and
a buffering layer located between said first metal layer and said plurality of conductive via plugs, wherein said buffering layer has a property selected from the group consisting of Young's modulus, hardness, strength and toughness greater than that of said first metal layer.

15. The bond pad structure of claim 14, wherein said second metal layer comprises copper or copper-based alloy, and said buffering layer comprises a tungsten layer.

16. A bond pad structure, comprising:
a copper-based metal layer formed on an integrated circuit substrate;
a passivation layer located over said copper-based metal layer and having at least one first opening that exposes at least part of said copper-based metal layer;
a first interposed, single-material layer, a stress-buffering, single-material layer, and a second interposed, single-material layer successively deposited along a bottom and sidewalls of said first opening; and
an aluminum-based bond pad layer located over and directly on said second interposed, single-material layer and electrically connected to said copper-based metal layer; wherein said first interposed, single-material layer serves as a metal-diffusion barrier layer directly on said copper-based metal layer, and conformally lines said bottom and said sidewalls of said first opening;

said second interposed, single-material layer serving as a metal-diffusion barrier layer directly on said stress-buffering, single-material layer; and said stress-buffering, single-material layer has a Young's modulus greater than that of at least one of said aluminum-based bond pad layer and said copper-based metal layer, and is directly on said first interposed, single-material layer along the bottom and sidewalls of said first openings.

17. The bond pad structure of claim 16, wherein said stress-buffering, single-material layer comprises a tungsten layer.

18. The bond pad structure of claim 17, wherein said stress-buffering, single-material layer has a thickness of from about 500 angstroms to about 5000 angstroms.

19. The bond pad structure of claim 16, wherein said first interposed, single-material layer comprises TaN, TiN, Ta, TiW, or WN.

20. The bond pad structure of claim 16, wherein said second interposed, single-material layer comprises TaN, TiN, Ta, TiW, or WN.

21. The bond pad structure of claim 16, wherein said integrated circuit substrate comprises at least one dielectric layer having a dielectric constant less than about 3.9, and said copper-based metal layer is formed in said dielectric layer.

22. The bond pad structure of claim 21, wherein said integrated circuit substrate comprises an integrated circuit, and at least part of said integrated circuit is located under said bond pad structure.

23. The bond pad structure of claim 16, wherein said passivation layer comprises at least one island region surrounded by said first opening, and said stress-buffering, single-material layer fills said first opening.

24. The bond pad structure of claim 16, wherein said stress-buffering, single-material layer has at least one second opening that is smaller than said first opening and exposes at least part of said first metal layer, and said aluminum-based bond pad layer fills said second opening.

25. A bond pad structure, comprising:
- a copper-based metal layer located over an integrated circuit substrate;
- a passivation layer located over said copper-based metal layer and having at least one first opening that exposes at least part of said copper-based metal layer;
- a first interposed, single-material layer lining said bottom and said sidewalls of said first opening of said passivation layer and directly on said exposed copper-based metal layer;
- a tungsten layer formed directly on said first interposed layer in said first opening, conformally along the bottom and sidewalls of said first openings;
- a second interposed, single-material layer formed directly on said tungsten layer; and
- an aluminum-based bond pad layer formed directly on said second interposed, single-material layer and electrically connected to said copper-based metal layer.

26. The bond pad structure of claim 25, wherein said tungsten layer has a thickness of from about 500 angstroms to about 1500 angstroms, and said aluminum-based bond pad layer has a thickness of from about 6500 angstroms to about 7500 angstroms.

27. The bond pad structure of claim 25, wherein said first interposed, single-material layer comprises TaN, TiN, Ta, TiW, or WN.

28. The bond pad structure of claim 25, wherein said second interposed, single-material layer comprises TaN, TiN, Ta, TiW, or WN.

29. The bond pad structure of claim 25, wherein said integrated circuit substrate comprises at least one dielectric layer having a dielectric constant less than about 3.9, and said copper-based metal layer is formed in said dielectric layer.

30. The bond pad structure of claim 25, wherein said integrated circuit substrate comprises an integrated circuit, and at least part of said integrated circuit is located under said bond pad structure.

31. The bond pad structure of claim 25, wherein said passivation layer comprises at least one island region surrounded by said first opening, and said tungsten layer fills said first opening.

32. The bond pad structure of claim 25, wherein said tungsten layer comprises at least one second opening that is smaller than said first opening and penetrates said second interposed, single-material layer and said first interposed, single-material layer to expose at least part of said copper-based metal layer, and said aluminum-based bond pad layer fills said second opening.

* * * * *